(12) United States Patent
Padmanabhan et al.

(10) Patent No.: US 9,773,895 B2
(45) Date of Patent: Sep. 26, 2017

(54) HALF-BRIDGE HEMT CIRCUIT AND AN ELECTRONIC PACKAGE INCLUDING THE CIRCUIT

(71) Applicant: SEMICONDUCTOR COMPONENTS INDUSTRIES, LLC, Phoenix, AZ (US)

(72) Inventors: Balaji Padmanabhan, Tempe, AZ (US); Prasad Venkatraman, Gilbert, AZ (US); Peter Moens, Erwetegem (BE); Mihir Mudholkar, Tempe, AZ (US); Joe Fulton, Chandler, AZ (US); Philip Celaya, Gilbert, AZ (US); Stephen St. Germain, Scottsdale, AZ (US); Chun-Li Liu, Scottsdale, AZ (US); Jason McDonald, Scottsdale, AZ (US); Alexander Young, Scottsdale, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/133,644

(22) Filed: Apr. 20, 2016

(65) Prior Publication Data
US 2016/0322969 A1 Nov. 3, 2016

Related U.S. Application Data

(60) Provisional application No. 62/154,705, filed on Apr. 30, 2015, provisional application No. 62/154,775, filed on Apr. 30, 2015.

(51) Int. Cl.
*H01L 29/15* (2006.01)
*H01L 29/747* (2006.01)
(Continued)

(52) U.S. Cl.
CPC ........ *H01L 29/747* (2013.01); *H01L 23/4952* (2013.01); *H01L 23/49524* (2013.01);
(Continued)

(58) Field of Classification Search
None
See application file for complete search history.

(56) References Cited

U.S. PATENT DOCUMENTS 9,252,253 B2 * 2/2016 Hwang ................. H01L 29/778
2002/0030267 A1 * 3/2002 Suzuki ................. H01L 23/481
257/698

(Continued)

*Primary Examiner* — David E Graybill
(74) *Attorney, Agent, or Firm* — Abel Law Group, LLP (57) ABSTRACT

A half-bridge circuit can include a high-side HEMT, a high-side switch transistor, a low-side HEMT, and a low-side switch transistor. The die substrates of the HEMTs can be coupled to the sources of their corresponding switch transistors. In another aspect, a packaged electronic device for a half-bridge circuit can have a design that can use shorter connectors that help to reduce parasitic inductance and resistance. In a further aspect, a packaged electronic device for a half-bridge circuit can include more than one connection along the bottom of the package allows less lead connections along the periphery of the packaged electronic device and can allow for a smaller package.

19 Claims, 7 Drawing Sheets

(51) Int. Cl.
*H01L 29/74* (2006.01)
*H01L 23/495* (2006.01)
*H01L 29/205* (2006.01)
*H01L 29/40* (2006.01)
*H01L 29/423* (2006.01)
*H01L 29/778* (2006.01)
*H01L 25/11* (2006.01)
*H03K 17/687* (2006.01)
*H01L 23/00* (2006.01)
*H01L 27/088* (2006.01)
*H01L 21/8258* (2006.01)
*H01L 27/06* (2006.01)

(52) U.S. Cl.
CPC .. *H01L 23/49541* (2013.01); *H01L 23/49562* (2013.01); *H01L 23/49575* (2013.01); *H01L 24/40* (2013.01); *H01L 25/115* (2013.01); *H01L 29/205* (2013.01); *H01L 29/404* (2013.01); *H01L 29/4238* (2013.01); *H01L 29/742* (2013.01); *H01L 29/7416* (2013.01); *H01L 29/7786* (2013.01); *H01L 29/7787* (2013.01); *H03K 17/6874* (2013.01); *H01L 21/8258* (2013.01); *H01L 27/0629* (2013.01); *H01L 27/088* (2013.01); *H01L 27/0883* (2013.01); *H01L 2224/0603* (2013.01); *H01L 2224/40245* (2013.01); *H01L 2224/48247* (2013.01); *H01L 2224/49113* (2013.01); *H01L 2224/73221* (2013.01); *H03K 2017/6878* (2013.01); *H03K 2217/0009* (2013.01); *H03K 2217/0018* (2013.01)

(56) References Cited

U.S. PATENT DOCUMENTS

| | | |
|---|---|---|
| 2007/0215899 A1 | 9/2007 | Herman |
| 2008/0237632 A1 | 10/2008 | Kinzer |
| 2012/0098038 A1* | 4/2012 | Shono ................ H01L 27/0605 257/195 |
| 2012/0235210 A1* | 9/2012 | Takemae ............. H01L 29/402 257/194 |
| 2015/0014631 A1* | 1/2015 | Ohlsson ............. H01L 21/0237 257/24 |
| 2015/0014740 A1* | 1/2015 | Briere ...................... H02H 7/10 257/133 |
| 2015/0108547 A1* | 4/2015 | Hwang ................ H01L 29/778 257/194 |
| 2016/0065203 A1* | 3/2016 | Zojer ................... H03K 17/687 327/109 |

\* cited by examiner

HALF-BRIDGE HEMT CIRCUIT AND AN ELECTRONIC PACKAGE INCLUDING THE CIRCUIT

CROSS-REFERENCE TO RELATED APPLICATIONS

This application claims priority under 35 U.S.C. §119(e) to U.S. Provisional Patent Application No. 62/154,705 entitled "Wide Band Gap Cascode Device, Its Use in a Half Bridge Circuit, and Related Packages," by Balaji Padmanabhan et al., filed Apr. 30, 2015, and to U.S. Provisional Patent Application No. 62/154,775 entitled "Wide Band Gap Cascode Device, Its Use in a Half Bridge Circuit, and Related Packages," by Balaji Padmanabhan et al., filed Apr. 30, 2015, which are assigned to the current assignee hereof and incorporated herein by reference in their entireties.

FIELD OF THE DISCLOSURE

The present disclosure relates to circuits and electronic packages, and more particularly, to half-bridge high-electron mobility transistor circuits and electronic packages including half-bridge high-electron mobility transistor circuits.

RELATED ART

High electron mobility transistors (HEMTs), and GaN transistors in particular, are used for their ability to carry large amounts of current at relatively high temperatures. Power HEMTs can be used in half-bridge circuits, and a particular arrangement includes a high-side power HEMT that is electrically connected to a low-side power HEMT. Such a circuit may have a limited switching speed because the circuit is controlled by the gates of the power HEMTs. Further improvements in half-bridge circuits including HEMTs are desired.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_yGa_{(1-y)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The terms "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, is intended to mean that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A circuit can include a first HEMT including a drain, a source, a gate, and a die substrate; a first transistor including a drain, a source and a gate; a second HEMT including a drain, a source, a gate, and a die substrate; and a second transistor including a drain, a source and a gate. The source of the first HEMT can be coupled to the drain of the first transistor; the source of the first transistor can be coupled to the drain of the second HEMT output terminal, and the die substrate of the first HEMT; the source of the second HEMT can be coupled to the drain of the second transistor; and the source of the second transistor can be coupled to the die substrate of the second HEMT. The gate of the first HEMT is coupled to the source of the first transistor, and the gate of the second HEMT is coupled to the source of the second transistor. The coupling of the die substrate of the HEMTs to the sources of the switch transistors allow for reducing the dynamic on resistance of the HEMT devices.

In another aspect, a packaged electronic device can include a package substrate having a top, a bottom, and a side periphery; a first HEMT die over the package substrate and having a drain bond pad and a source bond pad; and a second HEMT die over the package substrate and having a drain bond pad and a source bond pad. The side periphery of the package substrate can be closer to the drain bond pad of the first HEMT than to the source bond pad of the first HEMT, and the side periphery of the package substrate can be closer to the source bond pad of the second HEMT than to the drain bond pad of the second HEMT. The design can allow for shorter connectors, such as wire bonds, that help to reduce parasitic inductance and resistance.

In a further aspect, a packaged electronic device can include a package substrate having a top, a bottom, and a side periphery, wherein the package substrate comprises a drain lead along the side periphery, a ground lead along the bottom, and an output lead along the bottom. The packaged electronic device can further include a half-bridge circuit including a first HEMT die over the package substrate and having a drain bond pad and a source bond pad; a first transistor die over the package substrate and having a drain bond pad and a source bond pad; a second HEMT die over the package substrate and having a drain bond pad and a source bond pad; and a second transistor die over the package substrate and having a drain bond pad and a source bond pad. The drain bond pad of the first HEMT can be electrically connected to the drain lead of the package substrate; the source bond pad of the first transistor and the drain bond pad of the second HEMT can be electrically connected to the output lead of the package substrate; and the source of the second transistor can be electrically connected to the ground lead of the package substrate. More than one connection along the bottom of the package allows less lead connections along the periphery of the packaged electronic device and can allow for a smaller package.

The concepts as described herein are better understood with the embodiments as illustrated and described below. Such embodiments are intended to exemplify and not limit the scope of the present invention, which is defined by the appended claims.

Figure 1:
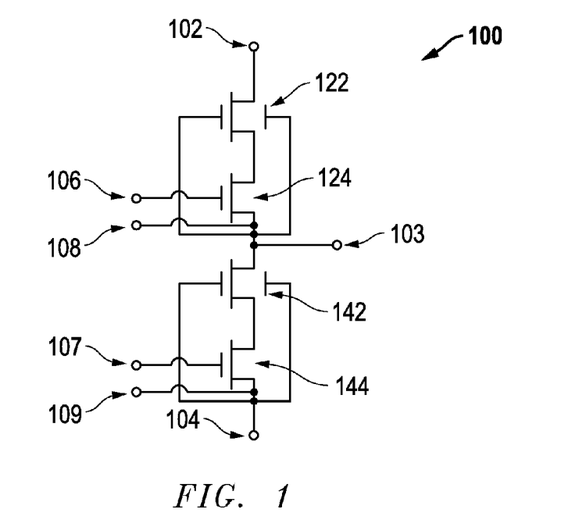
FIG. 1 includes a schematic of a half-bridge circuit including power HEMTs and switch transistors.

FIG. 1 includes a schematic of a half-bridge circuit 100 that includes two cascode circuits serially oriented with each cascode circuit including a HEMT and a switch transistor. A drain of a high-side HEMT 122 is coupled to drain terminal 102, and a source of the high-side HEMT 122 is coupled to a drain of the high-side switch transistor 124. A source of the high-side switch transistor 124 is coupled to a gate and a die substrate of the high-side HEMT 122, a drain of the low-side HEMT 142, a high-side Kelvin connection terminal 108, and an output terminal 103. A source of the low-side HEMT 142 is coupled to a drain of the low-side switch transistor 144. A source of the low-side switch transistor 144 is coupled to a gate and a die substrate of the low-side HEMT 142, a low-side Kelvin connection terminal 109, and a source terminal 104. The half-bridge circuit 100 is controlled by the gates of the switch transistors 124 and 144 that are coupled to the gate terminals 106 and 107. In another embodiment, the Kelvin connection terminals 108 and 109 may be omitted if needed or desired. In a particular embodiment, each of the couplings can be an electrical connection.

In the circuit 100, the die substrate connections of the HEMTs 122 and 142 to the sources of their corresponding switch transistors reduce the dynamic $R_{DSON}$ of the HEMT devices.

Figure 2:
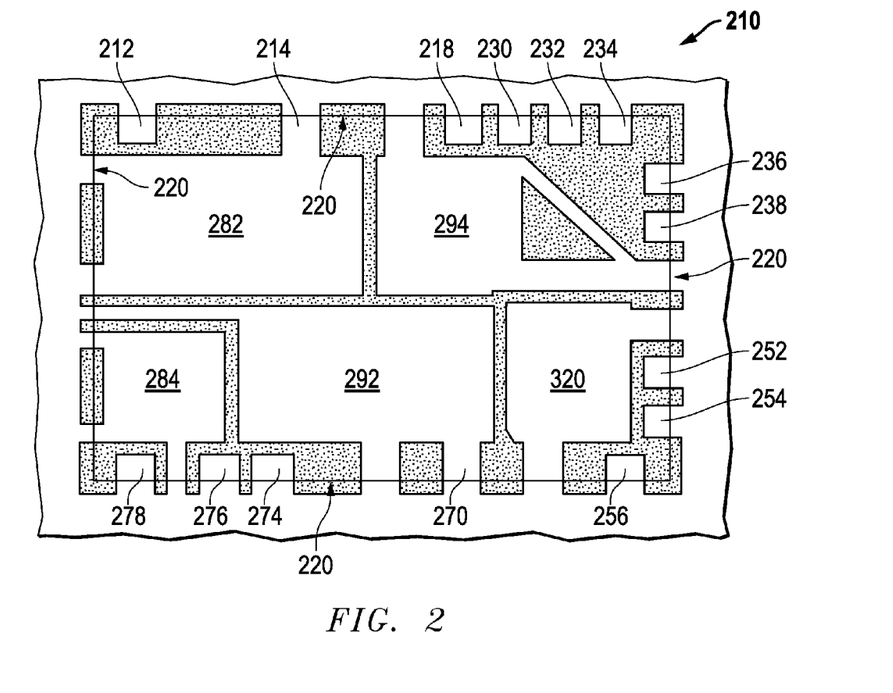
FIG. 2 includes an illustration of a top view of a package substrate for the circuit of FIG. 1.

FIG. 2 includes a top view of an exemplary package substrate 210 that can be used in particular embodiments. The package substrate 210 can be a sheet that includes a conductive material. In an embodiment, the package substrate 210 can include one or more conductive materials. In an embodiment, exposed surfaces may include Cu or a noble metal or a relatively oxidation-resistant conductive material. In a particular embodiment, the package substrate 210 can include a sheet of Cu or Cu alloy that is plated or otherwise coated with Ag or another noble metal. Areas not occupied by the sheet are voids. Thus, the package substrate 210 can include a pre-punched sheet of metal. The rectangular line 220 illustrates the location of a subsequent cut line that will be used to separate package leads along peripheral sides from one another.

The package substrate 210 includes a $V_{DD}$ lead 212, an output lead 214, a ground lead 218, a low-side driver lead 230, a ground lead 232, a low-side logic input lead 234 along one peripheral side; a high-side logic input lead 236, a $V_{CC}$ lead 238, a voltage boost lead 252, a high-side driver lead 254 along another peripheral side; and a bridge lead 256, a ground lead 270, output leads 274 and 276, and a high-side driver lead 278 along a further peripheral side. In the embodiment as illustrated, no external electrical connections are made to the package substrate along the last peripheral side. The organization and placement of leads along the same or different peripheral sides of the package substrate 210 may be changed for a particular application.

The package substrate 210 further includes package pads 282, 284, 292, 294, and 320, which are locations where die may be attached to the package substrate 210. The output lead 214 is an extension from the package pad 282, and the ground lead 270 is an extension from the package pad 292. The significance of the package pads 282 and 292 and the leads 214 and 270 will be addressed later in this specification.

Except as explicitly noted, electrical connections between bond pads of dies and their corresponding package leads and between die substrates and their corresponding package pads are within a packaged electronic device. External wiring or another conductor can be used to make electrical connections to different leads or lead and pad combinations outside the packaged electronic device; however, such electrical connections are not within the packaged electronic device.

Figure 3:
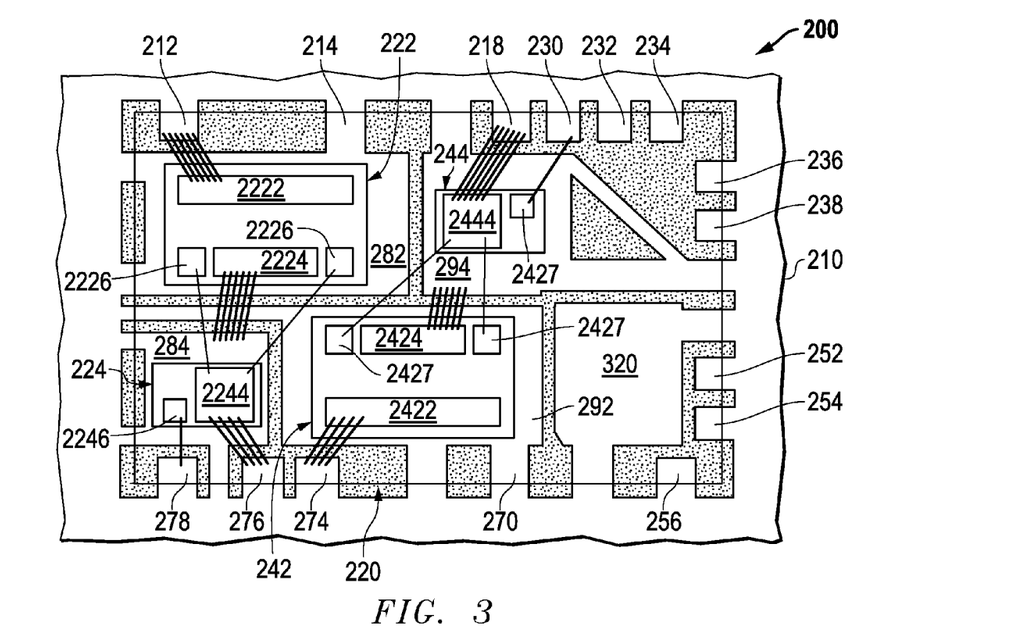
FIG. 3 includes an illustration of a top view of a partially completed packaged electronic device using the package substrate of FIG. 2 and including the circuit of FIG. 1 in accordance with an embodiment.

FIG. 3 includes a top side view of a partially completed packaged electronic device 200 of a physical embodiment for the half-bridge circuit 100 in FIG. 1. The packaged electronic device 200 includes a high-side HEMT die 222, a high-side switch transistor die 224, a low-side HEMT die 242, and a low-side switch transistor die 244. FIG. 3 illustrates the dies after die attach and wire bonding operations. The organization of the die 222, 224, 242, and 244 with respect to the package substrate 210 helps to provide relatively high current and relatively low parasitic inductance during normal operation. Connections between bond pad and package leads along the primary current paths are addressed first, then connections between corresponding HEMT and switch transistor die pairs along the primary current paths are addressed, followed by the remainder of the connections.

A drain bond pad 2222 of the high-side HEMT die 222 is close and electrically connected to the $V_{DD}$ lead 212, and a drain bond pad 2422 of the low-side HEMT die 242 is close and electrically connected to the output lead 274. A source bond pad 2244 of the high-side switch transistor die 224 is close and electrically connected to the output lead 276, and a source bond pad 2444 of the low-side switch transistor die 244 is close and electrically connected to the ground lead 218.

Connections between cascode HEMT-switch transistor pairs are oriented to be closer to the center of the package substrate 210 as compared to the connections described in the prior paragraph. Each of the switch transistor die 224 and 244 has a drain contact along the backside of the die and are electrically connected to the package pads 284 and 294, respectively. The electrical connections between the backsides of the switch transistor dies 224 and 244 and the package pads 284 and 294 can be accomplished with a conductive fastening material, such as solder (e.g., reflowed solder balls or bumps), a conductive adhesive (e.g., silver-filled epoxy), or the like. A source bond pad 2224 of the high-side HEMT die 222 is electrically connected to the package pad 284, which electrically connects the source of the high-side HEMT 122 (FIG. 1) to the drain of the high-side switch transistor 124. A source bond pad 2424 of the low-side HEMT die 242 is electrically connected to the package pad 294, which electrically connects the source of the low-side HEMT 142 (FIG. 1) to the drain of the low-side switch transistor 144. In another embodiment in which drain bond pads are provided on the top side of the switch transistor dies 224 and 244, electrical connections can be made between the source bond pads of the HEMT dies 222 and 242 and drain bond pads of their corresponding switch transistor dies 224 and 244.

Other connections are not along the primary current paths of the half-bridge circuit 100. Gate bond pad 2226 and 2427 of the HEMT dies 222 and 242 are electrically connected to the source bond pads 2244 and 2444 of their corresponding switch transistor dies 224 and 244. A gate bond pad 2246 of the high-side switch transistor die 224 is electrically connected to the high-side driver lead 278 of the package substrate 210, and a gate bond pad 2447 of the low-side switch transistor die 244 is electrically connected to the low-side driver lead 230 of the package substrate 210. The die substrate of the high-side HEMT die 222 is electrically connected to the package pad 282, and the die substrate of the low-side HEMT die 242 is electrically connected to the package pad 292. The electrical connections between the backside of the HEMT dies 222 and 242 and package pads 282 and 292 can be accomplished with a conductive fastening material, such as solder (e.g., reflowed solder balls), a conductive adhesive (e.g., silver-filled epoxy), or the like.

Connectors can be used to make the electrical connections as illustrated in FIG. 3. A connector can be a wire, a conductive bump, a clip, an interposer, or the like. The selection of a particular type of connector can be made by skilled artisans after considering performance and package configurations. As illustrated in the embodiment, many of the electrical connections are made with wires (illustrated as lines in FIG. 3). In an embodiment, some sets of wires may be replaced by a clip. Conductive bumps (for a flip chip connecting technique) may be used although the design of the package substrate may need to be altered.

After connections between the dies and the package substrate are completed, a plastic encapsulating material is formed around the dies 222, 224, 242, and 244 and the package substrate 210. Portions of the encapsulating material may be kept from covering portions of the package substrate so that external connections can be made to leads of the package substrate. After encapsulation, the packaged electronic device is completed by sawing or otherwise cutting the package substrate 210 outside the encapsulating material and along the line 220 (FIG. 2) to electrically separate the package leads from one other.

Some of the package pads of the package substrate 210 may allow for external electrical connections along a bottom side of the packaged electronic device. In an embodiment, the package pads 282 and 292 may be exposed or have conductors placed adjacent to them so that external electrical connections along the bottom surface of the packaged electronic device to the backsides of the HEMT dies 222 and 242 can be made. Alternatively, the output lead 214 can be used to make an electrical connection to the backside of the high-side HEMT die 222, or the ground lead 270 can be used to make an electrical connection to the backside of the low-side HEMT 242. Thus, a designer has flexibility to determine whether external electronic connections to the backside of each of the HEMT dies 222 and 242 are along the bottom of the packaged electronic device or to a corresponding lead along a peripheral side of the packaged electronic device. In another embodiment, the package pads 284 and 294 may also be exposed.

Within the packaged electronic device 200, exposed package leads are spaced apart and electrically isolated from one another. External connections (i.e., connections external to the packaged electronic device 200) are made to electrically connect the ground leads 218 and 270 to each other and the output leads 214, 274, and 276 to one another. The electrical connection to the ground lead 270 may occur via a backside contact to the package pad 292, and the electrical connection to the output lead 214 may occur via a backside contact to the package pad 282.

Figure 4:
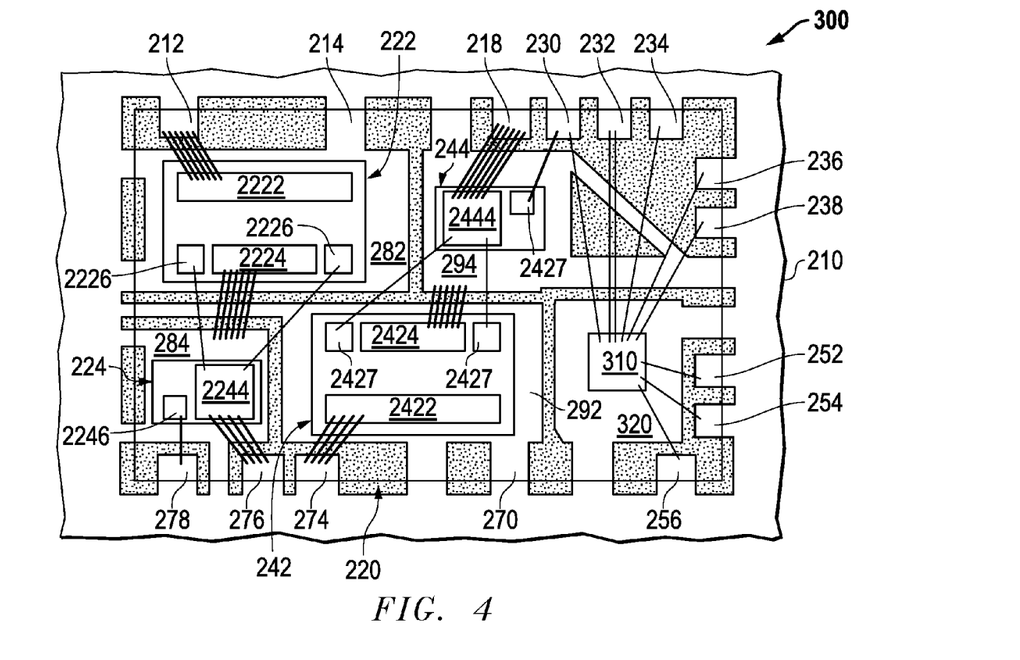
FIG. 4 includes an illustration of a top view of a partially completed packaged electronic device using the package substrate of FIG. 2 and including the circuit of FIG. 1 in accordance with another embodiment.

In the embodiment as illustrated in FIG. 3, the signals for controlling the circuit can be supplied externally to the high-side driver lead 278 and the low-side driver lead 230. In another embodiment, the signals to drive the switch transistors can be generated within the packaged electronic device. FIG. 4 includes an alternative embodiment in which a driver die 310 is used to control the half-bridge circuit 300 and to convert logic input signals to higher voltage signals needed to drive the gates of the switch transistors 124 and 144 (FIG. 1).

In FIG. 4, the driver die 310 includes a low-side driver bond pad that is electrically connected to the low-side driver lead 230, ground bond pads that are electrically connected to the ground lead 232, a low-side logic input bond pad that is electrically connected to the low-side logic input lead 234, a high-side logic input bond pad that is electrically connected to the high-side logic input lead 236, a $V_{CC}$ bond pad that is electrically connected to the $V_{CC}$ lead 238, a voltage boost bond pad that is electrically connected to the voltage boost lead 252, a high-side driver bond pad that is electrically connected to the high-side driver lead 254, and a bridge bond pad that is electrically connected to the bridge lead 256. A die substrate of the driver die 310 can be electrically connected to a package pad 320, the electrical connections between the backside of the driver die 310 and the package pad 320 can be accomplished with a conductive fastening material, such as solder (e.g., reflowed solder balls), a conductive adhesive (e.g., silver-filled epoxy), or the like. The die substrate of the driver die 310 can also be electrically isolated from the package pad 320 either by using a non-conductive adhesive, such as a non-conductive epoxy, etc., by using a ceramic interposer with conductive material on either side of the ceramic, or have isolation integrated monolithically in the driver die 310. The package pad 320 of the package substrate 210 may be exposed along a bottom side of the packaged electronic device. In an embodiment, the package pad 320 may be exposed or have a conductor placed adjacent to it so that an external electrical connection to the backsides of the driver die 310 can be made. In another embodiment, the package pad 320 may not be exposed external to the package.

Similar to the partially completed packaged electronic device 200 in FIG. 3, within the partially completed packaged electronic device 300 in FIG. 4, exposed package leads are spaced apart and electrically isolated from one another. External connections (i.e., connections external to the packaged electronic device 300) are made to electrically connect the ground leads 218, 234, and 270 to one another and the output leads 214, 274 and 276 to one another. Other external connections are made to electrically connect the high-side driver leads 254 and 278 to each other. The electrical connection to the ground lead 270 may occur via a backside contact to the package pad 292, the electrical connection to the output lead 214 may occur via a backside contact to the package pad 282. An electrical connection to the die substrate of the driver die 310 may occur via a backside contact to the package pad 320.

The package substrate 210 is useful for instances when the driver die 310 is or is not present. Thus, flexibility in manufacture can allow a decision relatively late in the process as to whether the driver die 310 is to be present within the packaged electronic device, and still use package substrate 210 regardless whether the driver die 310 is or is not used. In another embodiment, a smaller package substrate may be used. For example, the package substrate can end just after the low-side HEMT and switch transistor dies 242 and 244. This may achieved by using a different package substrate or using the package substrate 210 and after applying the encapsulation material, cutting the package substrate 210 closer to the package pads 292 and 294. Hence a smaller packaged electronic device can be obtained when a driver die is not present within the packaged electronic device.

Figure 5:
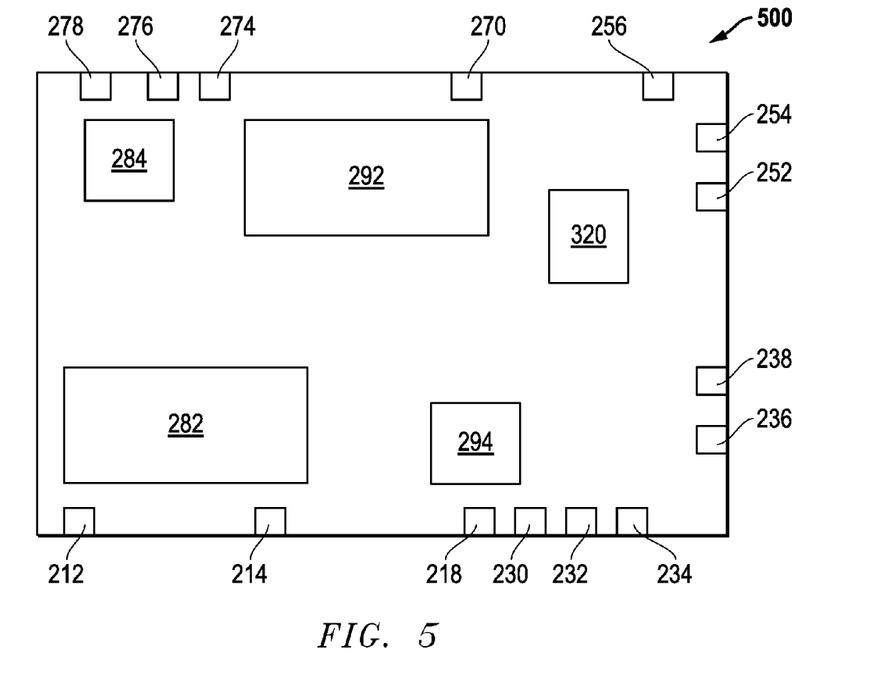
FIG. 5 includes an illustration of a bottom view of a substantially completed packaged electronic device after completing assembly operations for the partially completed device of FIG. 4.

FIG. 5 includes a bottom view of a substantially completed electronic device 500 after encapsulation and cutting operation. As compared to FIG. 4, the device is flipped over, so that the package leads and pads that are near the top of FIG. 4 are near the bottom of FIG. 5, and the package leads and pads that are near the bottom of FIG. 4 are near the top of FIG. 5. Any one of the packages pads 282, 284, 292, 294 and 320 may or may not be exposed along the bottom surface of the packaged electronic device 500. For example, the electrical connections to the package pads 282 and 292 may be via the bottom surface of the packaged electronic die 500 or may be made via the output leads 214 (for the substrate connection to high-side HEMT 122) or the ground lead 214 (for the substrate connection to low-side HEMT 142). After reading this specification, skilled artisan can determine which packaging pads are to be exposed along the bottom surface of the packaged electronic device 500, separate from corresponding package leads.

Figure 6:
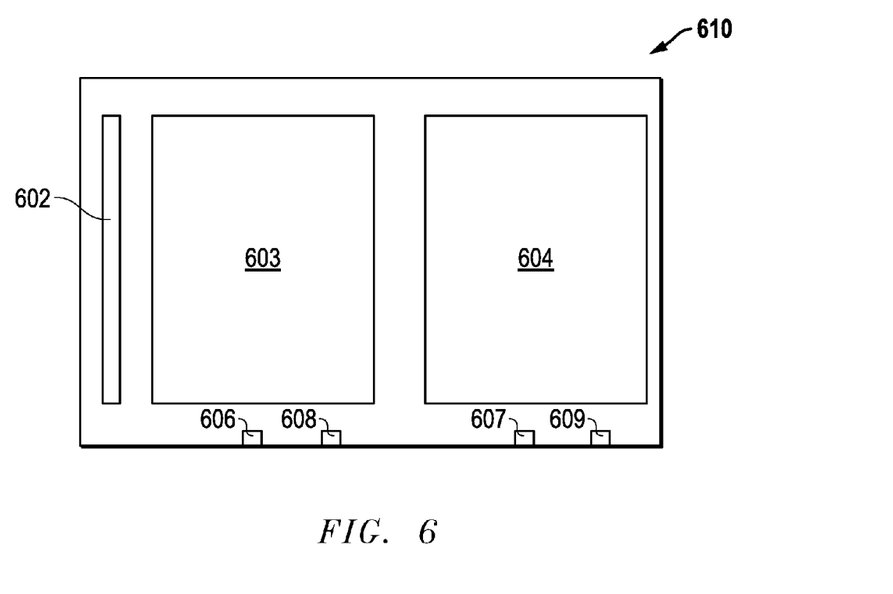
FIG. 6 includes an illustration of a top view of a package substrate for the circuit of FIG. 1.

Other designs for the packaged electronic device can be used. FIG. 6 includes a package substrate 610 that includes a $V_{DD}$ lead 602, an output pad 603, and ground pad 604, a high-side driver lead 606, a low-side driver lead 607, and Kelvin leads 608 and 609. In an embodiment, the package leads 602 and 606 to 609 can be along a peripheral side of the packaged electronic device. In another embodiment, the package pads 603 and 604 can allow for an electrical connection along the bottom surface of the packaged electronic device. In another embodiment, the Kelvin pads 608 and 609 may not be present.

The organization allows for higher voltage connections near the left-hand side of the package substrate 610, lower voltage connections near the right-hand side, and connections that can be at either the higher or lower voltage connections or an intermediate voltage therebetween near the center. In this manner, during normal operation, the voltages will decrease laterally from left to right in the figure. For example, $V_{DD}$ can be the highest voltage terminal of the circuit, and thus, the $V_{DD}$ lead 602 is near the left-hand side of the package substrate 610. The ground pad 604 and package leads 607 and 609 to the low-side components of the circuit are near the right-hand side of the package substrate 610. The output pad 603 and package leads 606 and 608 to the high-side components of the circuit are disposed between (1) the $V_{DD}$ lead 602 and (2) the ground pad 604 and leads 607 and 609.

Figure 7:
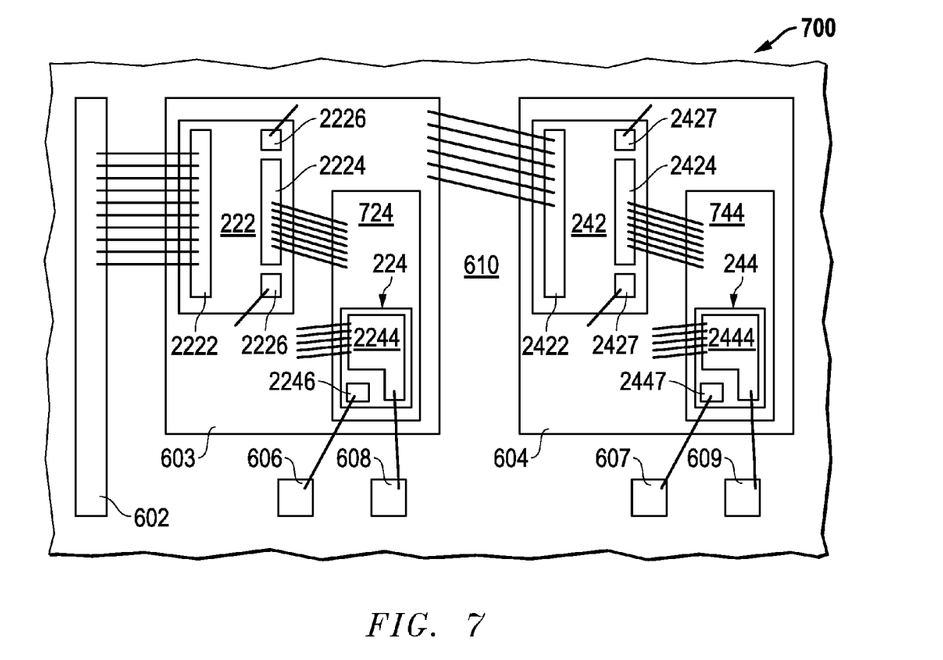
FIG. 7 includes an illustration of a top view of a partially completed packaged electronic device using the package substrate of FIG. 6 and including the circuit of FIG. 1 in accordance with an embodiment.

FIG. 7 includes a top view of a partially completed packaged electronic device 700 that includes the package substrate 610. In this embodiment, the switch transistor dies 224 and 244 can be physically coupled to intermediate substrates 724 and 744, respectively, where each intermediate substrate includes an insulating base covered by a conductive layer. Thus, backside drain contacts for the switch transistor dies 224 and 244 are electrically insulated from the underlying packaging pads 603 and 604, respectively, due to the insulating base of the intermediate substrates 724 and 744. The dies 224 and 244 can be physically coupled and electrically connected to the conductive layer along the exposed top surface of the intermediate substrates 724 and 744, respectively.

For the high-side HEMT die 222, the drain bond pad 2222 is electrically connected to the $V_{DD}$ lead 602, the source bond pad 2224 is electrically connected to the conductive layer of the intermediate substrate 724, and the gate bond pads 2226 and the die substrate of the die 222 are electrically connected to the output pad 603. For the high-side switch transistor 224, the backside drain contact is electrically connected to the conductive layer of the intermediate substrate 724, the source bond pad 2244 is electrically connected to the output pad 603 and the Kelvin lead 608, and the gate bond pad 2246 is electrically connected to the high-side driver lead 606. For the low-side HEMT die 242, the drain bond pad 2422 is electrically connected to the output pad 603, the source bond pad 2424 is electrically connected to the conductive layer of the intermediate substrate 744, and the gate bond pads 2427 and the die substrate of the die 242 are electrically connected to the ground pad 604. For the low-side switch transistor 244, the backside drain contact is electrically connected to the conductive layer of the intermediate substrate 744, the source bond pad 2444 is electrically connected to the ground pad 604 and the Kelvin lead 609, and the gate bond pad 2447 is electrically connected to the low-side driver lead 607.

Figure 8:
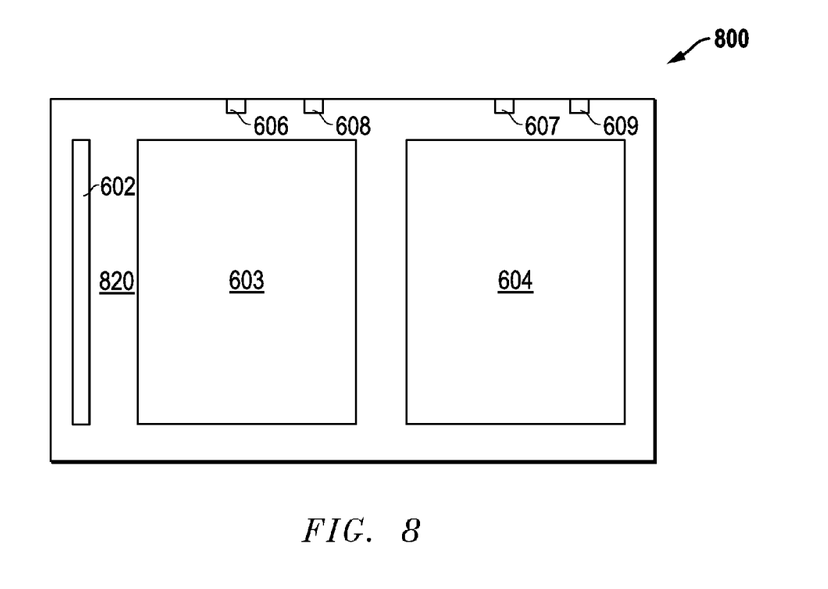
FIG. 8 includes an illustration of a bottom view of a substantially completed packaged electronic device after completing assembly operations for the partially completed device of FIG. 7.

FIG. 8 includes a bottom view of a substantially completed packaged electronic device 800. The partially completed packaged electronic device 700 as illustrated in FIG. 7 is placed into a mold, and a plastic encapsulant material 820 is injected into the mold. The plastic encapsulant material covers both sides of the package substrate 610 with the exceptions for portions of the leads 602 and 606 to 609 and the package pads 603 and 604. A saw is used to cut off portions of the package substrate 610 that extends beyond the edges of the encapsulating material to form the packaged electronic device 800. The packaged electronic device 800 is ready for use in a socket, connection to a circuit or printed wiring board, or the like.

Figure 9:
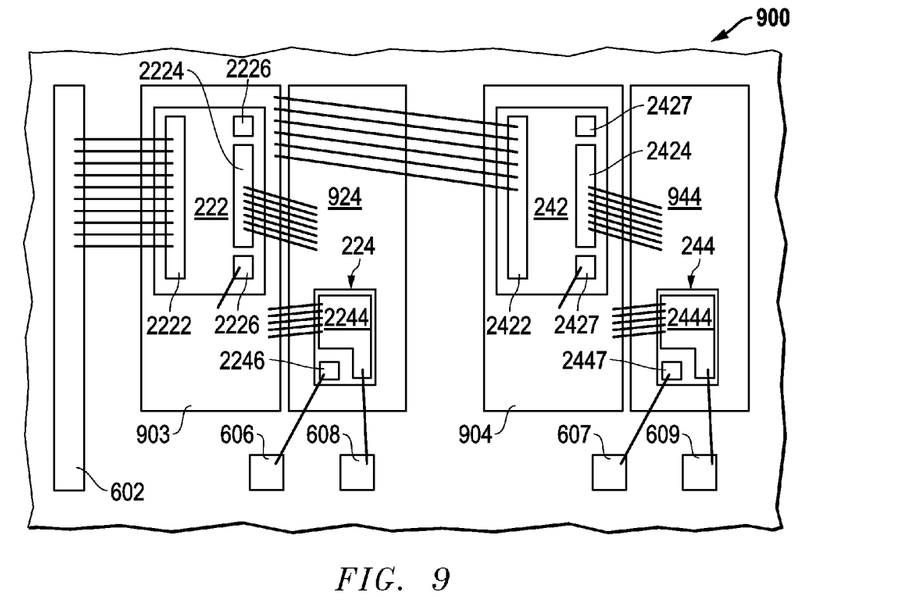
FIG. 9 includes an illustration of a top view of a partially completed packaged electronic device using another package substrate and including the circuit of FIG. 1 in accordance with another embodiment.

In another embodiment, the intermediate substrates 724 and 744 of FIG. 7 can be replaced by package pads 924 and 944 of FIG. 9, and the package pads 603 and 604 of FIGS. 6 and 7 can be reduced in size so that package pads 903, 904, 924, and 944 of FIG. 9 lie along the same plane. In a particular embodiment, all of the package pads and leads in FIG. 9 can be from the same sheet of conductive material.

In the embodiment of FIG. 9, for the high-side HEMT die 222, the drain bond pad 2222 is electrically connected to the $V_{DD}$ lead 602, the source bond pad 2224 is electrically connected to the package pad 924, and the gate bond pads 2226 and the die substrate of the die 222 are electrically connected to the output pad 903. For the high-side switch transistor 224, the backside drain contact is electrically connected to the package pad 924, the source bond pad 2244 is electrically connected to the output pad 903 and the Kelvin lead 608, and the gate bond pad 2246 is electrically connected to the high-side driver lead 606. For the low-side HEMT die 242, the drain bond pad 2422 is electrically connected to the output pad 903, the source bond pad 2424 is electrically connected to the package pad 944, and the gate bond pads 2427 and the die substrate of the die 242 are electrically connected to the ground pad 904. For the low-side switch transistor 244, the backside drain contact is electrically connected to the package pad 944, the source bond pad 2444 is electrically connected to the ground pad 904 and the Kelvin lead 609, and the gate bond pad 2447 is electrically connected to the low-side driver lead 607.

In the embodiments as illustrated in FIGS. 7 to 9, external connections to the leads 602 and 606 to 609 are along the same peripheral side of the packaged electronic device. In another embodiment, the package leads may be along different peripheral sides. For example, the $V_{DD}$ lead 602 and the low-side driver lead 607 and the Kelvin lead 609 may extend from a peripheral side, and the high-side driver lead 606 and the Kelvin lead 608 may extend from a different peripheral side, such as an opposite peripheral side of the packaged electronic device. Referring to FIG. 9, the positions of the leads 607 and 609 and the pads 904 and 944 are reversed so that the leads 607 and 609 are along the peripheral side closer to the top of the FIG. 9. The position of the dies 242 and 244 and their corresponding connections within the electronic package may be changed to allow for proper connections that do not interfere with other connections within the packaged electronic device. For example, the die 244 may be rotated 180° and moved closer to the peripheral side with the top of FIG. 9. The die 242 may be moved so that the center of the die 242 is closer to a center of the pad 904. The connection between source bond pad 2224 of the high-side HEMT die 222 to the pad 924 may be closer to the top of FIG. 9, and the connections between the drain bond pad 2424 of the low-side HEMT die 242 to the ground pad 903 may pass over the center of the pad 924. Also, the external connection to the $V_{DD}$ lead 602 may be made at the peripheral side closer to the top of the FIG. 9, as opposed to the bottom of FIG. 9.

Figure 10:
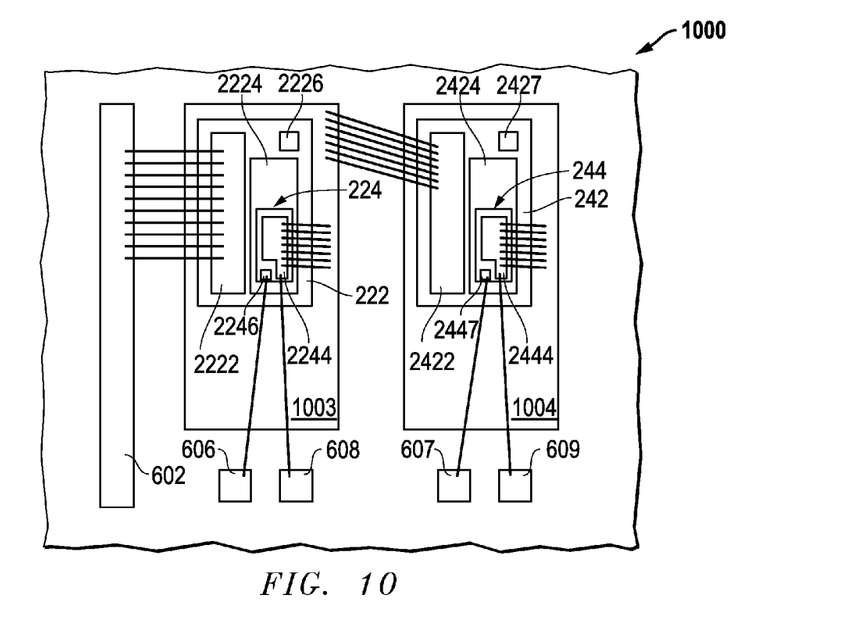
FIG. 10 includes an illustration of a top view of a partially completed packaged electronic device using a further package substrate and including the circuit of FIG. 1 in accordance with another embodiment.

In a further embodiment illustrated in FIG. 10, the switch transistor dies 224 and 244 can be physically coupled to their corresponding HEMT dies 222 and 242. Thus, the intermediate substrates 724 and 744 of FIG. 7 and the package pads 924 and 944 of FIG. 9 are not needed. Furthermore, the package pads 1003 and 1004 may be smaller than the package pad 603 and 604 as illustrated in FIGS. 6 and 7. By stacking the dies within the packaged electronic device 1000, the footprint can be significantly smaller than for the packaged electronic devices 700 and 900.

In FIG. 10, for the high-side HEMT die 222, the drain bond pad 2222 is electrically connected to the $V_{DD}$ lead 602, the source bond pad 2224 is electrically connected to the drain contact along a bottom surface of the high-side switch transistor die 224, and the gate bond pad 2226 and the die substrate of the die 222 are electrically connected to the output pad 1003. For the high-side switch transistor 224, the source bond pad 2244 is electrically connected to the output pad 1003 and the Kelvin lead 608, and the gate bond pad 2246 is electrically connected to the high-side driver lead 606. For the low-side HEMT die 242, the drain bond pad 2422 is electrically connected to the output pad 1003, the source bond pad 2424 is electrically connected to the drain contact along a bottom surface of the low-side switch transistor die 244, and the gate bond pad 2427 and the die substrate of the die 242 are electrically connected to the ground pad 1004. For the low-side switch transistor 244, the source bond pad 2444 is electrically connected to the ground pad 1004 and the Kelvin lead 609, and the gate bond pad 2447 is electrically connected to the low-side driver lead 607.

In a further embodiment, the Kelvin connections in any or all of the previously described embodiments are not required. The Kelvin leads in the embodiments described herein can be removed if needed or desired for a particular application.

Electrical connections between any of the bond pads or die substrates of the dies and corresponding package leads or pads of the packages substrates may be made by a connector. Each of the connectors may be in any one of a variety of forms. A connector can be a wire, a conductive bump, a clip, an interposer, or the like. In an embodiment, a clip may be used and is useful for connections in which current flow is large. In another embodiment, the connector that contacts a die substrate and the package pad can include a solder or a conductive adhesive, such conductive epoxy, etc.

Figure 11:
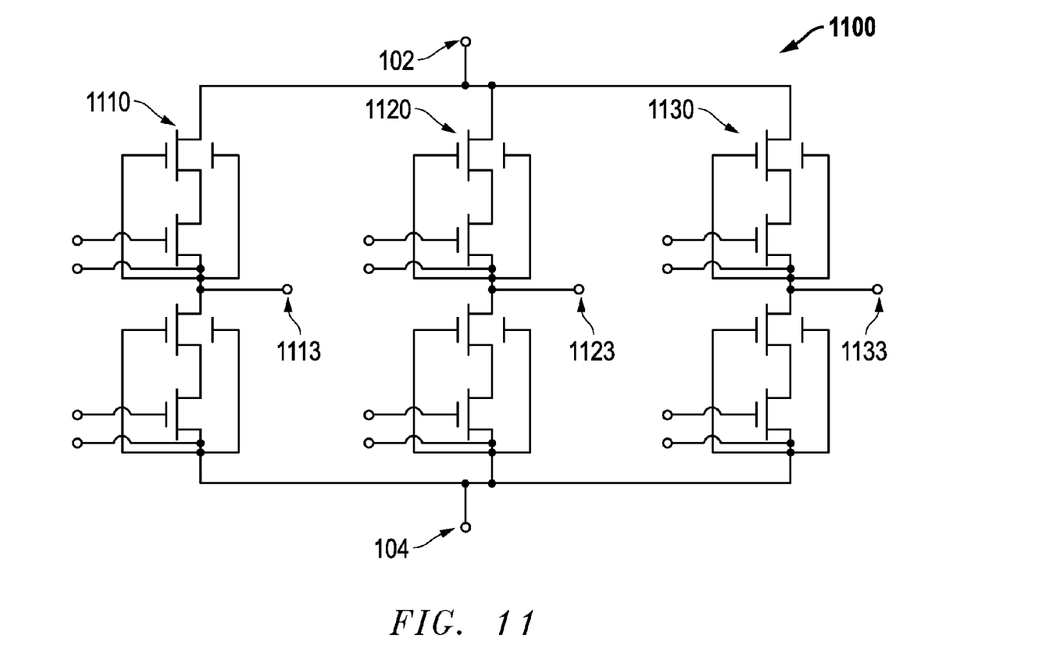
FIG. 11 includes a schematic of a circuit including a plurality of half-bridge circuits in accordance with an embodiment.

In another embodiment, half-bridge circuits can be connected in parallel, such as illustrated in FIG. 11. The electronic device 1100 can include half-bridge circuits 1110, 1120, and 1130, each of which is substantially identical to the half-bridge circuit 100 (FIG. 1) as previously described. Such a configuration can allow for the independent control of different half-bridge circuits within the electronic device to provide different output signals at the output terminals and still use the same power supply rails ($V_{DD}$ and ground) for the circuits.

Figure 12:
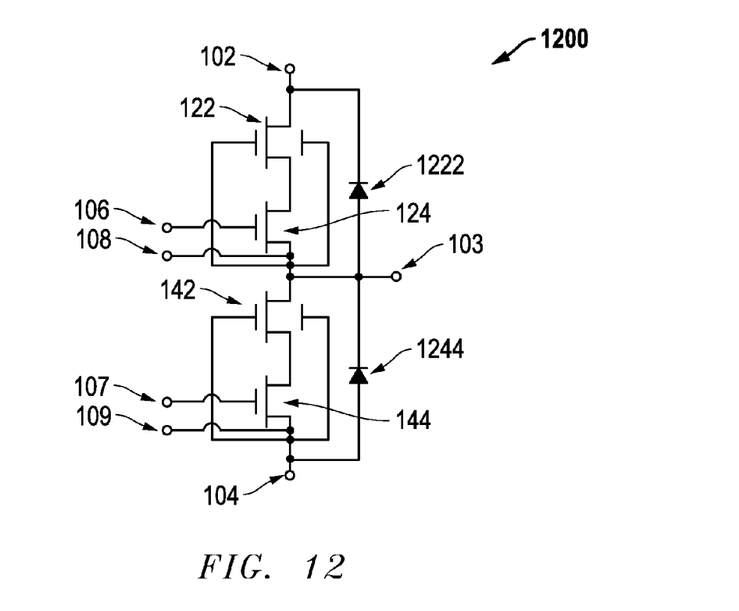
FIG. 12 includes a schematic of the half-bridge circuit of FIG. 1, further including diodes coupled between the output terminal and the power supply terminals.

In yet another embodiment, diodes can be implemented to reduce voltage swings when performing switching operations with the half-bridge circuit. FIG. 12 includes a schematic of a half-bridge circuit 1200 that is similar to the half-bridge circuit 100 of FIG. 1. In FIG. 12, diodes 1222 and 1244 are added to the circuit. The cathode of the diode 1222 is coupled to the drain of the high-side HEMT 122, and the anode of the diode 1222 is coupled to the output terminal 103. The cathode of the diode 1244 is coupled to the output terminal 103, and the anode of the diode 1244 is coupled to source of the low-side switch transistor 144. The diodes 1222 and 1244 can help to reduce ringing at the output node during switching operations.

Figure 13:
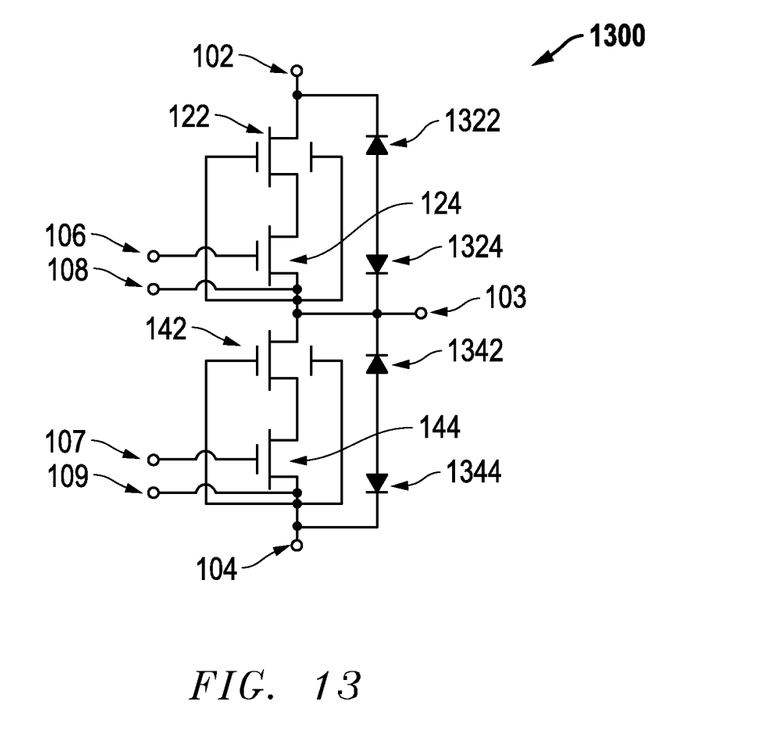
FIG. 13 includes a schematic of the half-bridge circuit of FIG. 1, further including back-to-back diodes coupled across each of the cascode circuits within the half-bridge circuit.

In still a further embodiment as illustrated in FIG. 13, back-to-back diodes may be used to protect high-side and low-side cascode circuits of the half bridge circuit. FIG. 13 includes a schematic of a half-bridge circuit 1300 includes diodes 1322 and 1324 to protect the high-side cascode circuit that includes the transistors 122 and 124, and diodes 1342 and 1344 to protect the low-side cascode circuit that includes the transistors 142 and 144. In an embodiment, a cathode of the diode 1322 is coupled to the drain of the high-side HEMT, anodes of the diodes 1322 and 1324 are coupled to each other, and a cathode of the diode 1324 is coupled to the source of the high-side switch transistor. In another embodiment, a cathode of the diode 1342 is coupled to the drain of the low-side HEMT, anodes of the diodes 1342 and 1344 are coupled to each other, and a cathode of the diode 1344 is coupled to the source of the low-side switch transistor. The diodes can have a breakdown voltage less than the drain-to-source breakdown voltages of their corresponding high-side and low-side cascode circuits.

In a further embodiment, other passive components or arrangements of diodes and such other components may be used to reduce ringing, protect components, or reduce energy losses for the half-bridge circuits described herein.

Embodiments as described herein provide benefits over conventional circuits and electronic devices. The die substrates of the HEMTs 122 and 142 and are electrically connected to the sources of the switch transistors 124 and 144. The die substrates of the HEMT dies 222 and 242 are electrically connected to the source bond pads of the switch transistor dies 224 and 244, via package pads within packaged electronic devices. The die substrates of the HEMT 122 and 144 are connected to the sources of their corresponding switching transistor within each cascode to reduce dynamic $R_{DSON}$.

As compared to half-bridge circuits with only the HEMT, the switch transistors allow for faster switching operations. The gate voltages needed to activate each cascode circuit within the half-bridge circuit is in a range of 5 V to 30 V. Without the switch transistors, for the HEMT-only circuits need voltages significantly further from 0 V to deactivate the HEMT transistors.

Packaged electronic devices are designed to allow high current and low parasitic inductance and capacitance. The organization of the die and leads allow for relatively short connectors (e.g., wires) to be used. The shorter connectors help to keep resistance and inductance low. The organization of the package substrate to keep voltage differences over short distances lower helps to reduce capacitive coupling. Thus, the lower parasitic characteristics allow for higher current flow and faster switching speeds and less energy losses. Kelvin connections are added as an option to determine more accurately the voltage on the source of the switching transistors in the high side and low side cascode comprising the half bridge circuit. This voltage can be used as a reference voltage for the high-side and low-side gate drive. This helps in more precisely controlling the turn on and turn off of the switching transistors and reducing the impact of parasitic in packages on the gate control.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

A circuit, comprising:
a first HEMT including a drain, a source, a gate, and a die substrate;
a first transistor including a drain, a source and a gate;
a second HEMT including a drain, a source, a gate, and a die substrate; and
a second transistor including a drain, a source and a gate, wherein:
the source of the first HEMT is coupled to the drain of the first transistor;
the source of the first transistor is coupled to the drain of the second HEMT an output terminal, and the die substrate of the first HEMT;
the source of the second HEMT is coupled to the drain of the second transistor; and
the source of the second transistor is coupled to the die substrate of the second HEMT.

Embodiment 2

The circuit of Embodiment 1, wherein the gate of the first transistor is coupled to a high-side gate terminal, and the gate of the second transistor is coupled to a low-side gate terminal.

Embodiment 3

The circuit of Embodiment 1, wherein the drain of the first HEMT is coupled to a high-side voltage supply terminal, and source of the second transistor is coupled to a low-side voltage supply terminal.

Embodiment 4

The circuit of Embodiment 1, wherein the gate of the first HEMT is coupled to the source of the first transistor, and the gate of the second HEMT is coupled to the source of the second transistor.

Embodiment 5

The circuit of Embodiment 1, wherein the first and second transistors are Si MOSFETs.

Embodiment 6

The circuit of Embodiment 1, wherein:
the first HEMT and the first transistor are parts of a same die;
the second HEMT and the second transistor are parts of the same die; or
the first HEMT, the first transistor, the second HEMT, and the second transistor are parts of the same die.

Embodiment 7

The circuit of Embodiment 1, wherein the first and second HEMTs and the first and second transistors are on different dies as compared to one another.

Embodiment 8

The circuit of Embodiment 1, wherein the first and second transistors are enhancement mode transistors.

Embodiment 9

A packaged electronic device, comprising:
a package substrate having a top, a bottom, and a side periphery;
a first HEMT die over the package substrate and having a drain bond pad and a source bond pad; and
a second HEMT die over the package substrate and having a drain bond pad and a source bond pad,
wherein:
the side periphery of the package substrate is closer to the drain bond pad of the first HEMT than to the source bond pad of the first HEMT; and
the side periphery of the package substrate is closer to the source bond pad of the second HEMT than to the drain bond pad of the second HEMT.

Embodiment 10

The packaged electronic device of Embodiment 9, further comprising a first transistor die over the package substrate, wherein the drain of the first transistor is coupled to the source of the first HEMT; and a second transistor die over the package substrate, wherein the source of the second HEMT is coupled to the drain of the second transistor.

Embodiment 11

The packaged electronic device of Embodiment 10, wherein within the packaged electronic device a source bond pad of the first transistor die is electrically connected to a first output lead of the package substrate; and the drain bond pad of the second HEMT is electrically connected to a second output lead of the package substrate, wherein the second output lead is spaced apart from the first output lead.

Embodiment 12

The packaged electronic device of Embodiment 10, wherein the first transistor, the second transistor, or each of the first and second transistors is a field-effect transistor having a drain connection along a surface of its corresponding die opposite a surface of its corresponding die that has a source bond pad and a gate bond pad of the first transistor.

Embodiment 13

The packaged electronic device of Embodiment 10, wherein within the packaged electronic device a die substrate of the second HEMT die is electrically connected to a first ground lead of the package substrate; and the source bond pad of the second transistor is electrically connected to a second ground lead of the package substrate, wherein the second ground lead is spaced apart from the first ground lead.

Embodiment 14

A packaged electronic device, comprising:
a package substrate having a top, a bottom, and a side periphery, wherein the package substrate comprises a drain lead along the side periphery, a ground lead along the bottom, and an output lead along the bottom; and
a half-bridge circuit including:
a first HEMT die over the package substrate and having a drain bond pad and a source bond pad;
a first transistor die over the package substrate and having a drain bond pad and a source bond pad;
a second HEMT die over the package substrate and having a drain bond pad and a source bond pad; and
a second transistor die over the package substrate and having a drain bond pad and a source bond pad,
wherein:
the drain bond pad of the first HEMT is electrically connected to the drain lead of the package substrate;
the source bond pad of the first transistor and the drain bond pad of the second HEMT are electrically connected to the output lead of the package substrate; and
the source of the second transistor is electrically connected to the ground lead of the package substrate.

Embodiment 15

The packaged electronic device of Embodiment 14, wherein:
the package substrate includes a first Kelvin lead and a second Kelvin lead;
the source of the first transistor has a connection to the output lead of the package substrate and a separate connection to the first Kelvin lead; and
the source of the second transistor has a connection to the ground lead of the package substrate and a separate connection to the second Kelvin lead.

Embodiment 16

The packaged electronic device of Embodiment 15, wherein:
the package substrate includes a first gate lead and a second gate lead;
the gate of the first transistor is electrically connected to the first gate lead;
the gate of the second transistor is electrically connected to the second gate lead, and
the first gate lead, the second gate lead, the first Kelvin lead, and the second Kelvin lead are along the side periphery of the package substrate.

Embodiment 17

The packaged electronic device of Embodiment 14, wherein from a bottom view:
the package substrate includes a first peripheral side and a second peripheral side opposite the second peripheral side;
the first peripheral side is closer to the drain lead than to each of the output lead and the ground lead;

the second peripheral side is closer to the source lead than to each of the output lead and the drain lead; and
the output lead is disposed between the drain lead and the ground lead.

Embodiment 18

The packaged electronic device of Embodiment 17, wherein the first transistor die is mounted over the first HEMT die; and the second transistor die is mounted over the second HEMT die.

Embodiment 19

The packaged electronic device of Embodiment 14, wherein the first transistor die is mounted over and electrically insulated from the output lead of the package substrate; and the second transistor die is mounted over and electrically insulated from the ground lead of the package substrate.

Embodiment 20

The packaged electronic device of Embodiment 14, wherein:
the first transistor die is mounted over a first conductive land of the package substrate;
the second transistor die is mounted over a second conductive land of the package substrate; and
each of the first and second lands of the package substrate is not electrically connected to an external lead of the package substrate.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Accordingly, the disclosure is to be regarded as illustrative rather than restrictive.

What is claimed is:

1. A circuit, comprising:
a first HEMT including a drain, a source, a gate, and a die substrate;
a first transistor including a drain, a source and a gate;
a second HEMT including a drain, a source, a gate, and a die substrate; and
a second transistor including a drain, a source and a gate, wherein:
the source of the first HEMT is coupled to the drain of the first transistor;
the source of the first transistor is coupled to the drain of the second HEMT an output terminal, and the die substrate of the first HEMT;
the source of the second HEMT is coupled to the drain of the second transistor; and
the source of the second transistor is coupled to the die substrate of the second HEMT.

2. The circuit of claim 1, wherein the gate of the first transistor is coupled to a high-side gate terminal, and the gate of the second transistor is coupled to a low-side gate terminal.

3. The circuit of claim 1, wherein the drain of the first HEMT is coupled to a high-side voltage supply terminal, and the source of the second transistor is coupled to a low-side voltage supply terminal.

4. The circuit of claim 1, wherein the gate of the first HEMT is coupled to the source of the first transistor, and the gate of the second HEMT is coupled to the source of the second transistor.

5. The circuit of claim 1, wherein the first and second transistors are Si MOSFETs.

6. The circuit of claim 1, wherein:
the first HEMT and the first transistor are parts of a same die;
the second HEMT and the second transistor are parts of the same die; or
the first HEMT, the first transistor, the second HEMT, and the second transistor are parts of the same die.

7. The circuit of claim 1, wherein the first and second HEMTs and the first and second transistors are on different dies as compared to one another.

8. The circuit of claim 1, wherein the first and second transistors are enhancement mode transistors.

9. A packaged electronic device, comprising:
a package substrate having a top, a bottom, and a side periphery;
a first HEMT die over the package substrate and having a drain bond pad and a source bond pad; and
a first transistor die over the package substrate and having a drain bond pad coupled to the source bond pad of the first HEMT; and
a second HEMT die over the package substrate and having a drain bond pad and a source bond pad; and
a second transistor die over the package substrate and having a drain bond pad coupled to the source bond pad of the second HEMT,
wherein:
the side periphery of the package substrate is closer to the drain bond pad of the first HEMT than to the source bond pad of the first HEMT; and
the side periphery of the package substrate is closer to the source bond pad of the second HEMT than to the drain bond pad of the second HEMT.

10. The packaged electronic device of claim 9, wherein within the packaged electronic device:
a source bond pad of the first transistor die is electrically connected to a first output lead of the package substrate; and
the drain bond pad of the second HEMT is electrically connected to a second output lead of the package substrate, wherein the second output lead is spaced apart from the first output lead.

11. The packaged electronic device of claim 9, wherein the first transistor die, the second transistor die, or each of the first and second transistor dies is a field-effect transistor having a drain connection along a surface of its corresponding die opposite a surface of its corresponding die that has a source bond pad and a gate bond pad of the first transistor.

12. The packaged electronic device of claim 9, wherein within the packaged electronic device:
a die substrate of the second HEMT die is electrically connected to a first ground lead of the package substrate; and
a source bond pad of the second transistor die is electrically connected to a second ground lead of the package substrate, wherein the second ground lead is spaced apart from the first ground lead.

13. A packaged electronic device, comprising:
a package substrate having a top, a bottom, and a side periphery, wherein the package substrate comprises a drain lead along the side periphery, a ground lead along the bottom, and an output lead along the bottom; and
a half-bridge circuit including:
a first HEMT die over the package substrate and having a drain bond pad and a source bond pad;
a first transistor die over the package substrate and having a drain bond pad and a source bond pad;
a second HEMT die over the package substrate and having a drain bond pad and a source bond pad; and
a second transistor die over the package substrate and having a drain bond pad and a source bond pad,
wherein:
the drain bond pad of the first HEMT die is electrically connected to the drain lead of the package substrate;
the source bond pad of the first transistor die and the drain bond pad of the second HEMT die are electrically connected to the output lead of the package substrate; and
the source bond pad of the second transistor die is electrically connected to the ground lead of the package substrate.

14. The packaged electronic device of claim 13, wherein:
the package substrate includes a first Kelvin lead and a second Kelvin lead;
the source bond pad of the first transistor die has a connection to the output lead of the package substrate and a separate connection to the first Kelvin lead; and
the source bond pad of the second transistor die has a connection to the ground lead of the package substrate and a separate connection to the second Kelvin lead.

15. The packaged electronic device of claim 14, wherein:
the package substrate includes a first gate lead and a second gate lead;
a gate bond pad of the first transistor die is electrically connected to the first gate lead;
a gate bond pad of the second transistor die is electrically connected to the second gate lead, and
the first gate lead, the second gate lead, the first Kelvin lead, and the second Kelvin lead are along the side periphery of the package substrate.

16. The packaged electronic device of claim 13, wherein from a bottom view:

the package substrate includes a first peripheral side and a second peripheral side opposite the second peripheral side;

the first peripheral side is closer to the drain lead than to each of the output lead and the ground lead;

the second peripheral side is closer to the source lead than to each of the output lead and the drain lead; and the output lead is disposed between the drain lead and the ground lead.

17. The packaged electronic device of claim 16, wherein:

the first transistor die is mounted over the first HEMT die; and the second transistor die is mounted over the second HEMT die.

18. The packaged electronic device of claim 13, wherein:

the first transistor die is mounted over and electrically insulated from the output lead of the package substrate; and the second transistor die is mounted over and electrically insulated from the ground lead of the package substrate.

19. The packaged electronic device of claim 13, wherein:

the first transistor die is mounted over a first conductive land of the package substrate;

the second transistor die is mounted over a second conductive land of the package substrate; and each of the first and second lands of the package substrate is not electrically connected to an external lead of the package substrate.

\* \* \* \* \*